(12) United States Patent
Chen et al.

(10) Patent No.: US 9,961,998 B2
(45) Date of Patent: May 8, 2018

(54) DRIVING MECHANISM AND GUIDE FITTING FOR SLIDE RAIL ASSEMBLY

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Hsiu-Chiang Liang, Kaohsiung (TW); Ci-Bin Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days. days.

(21) Appl. No.: 15/175,046

(22) Filed: Jun. 7, 2016

(65) Prior Publication Data

US 2017/0135480 A1    May 18, 2017

(30) Foreign Application Priority Data

Nov. 12, 2015    (TW) .............................. 104137453 A (51) Int. Cl.
*A47B 88/40*    (2017.01)
*A47B 88/04*    (2006.01)
*F16H 19/04*    (2006.01)
*A47B 88/08*    (2006.01)

(52) U.S. Cl.
CPC .......... *A47B 88/0481* (2013.01); *A47B 88/08* (2013.01); *F16H 19/04* (2013.01); *A47B 2210/0056* (2013.01); *A47B 2210/0075* (2013.01); *A47B 2210/0091* (2013.01)

(58) Field of Classification Search
CPC ..... A47B 88/0481; A47B 88/08; A47B 88/40; A47B 88/467; A47B 88/47; F16H 19/04
USPC ..... 312/319.1, 330.1, 334.1, 334.44, 334.46, 312/334.47
See application file for complete search history.

(56) References Cited

U.S. PATENT DOCUMENTS

| 5,207,781 | A | 5/1993 | Rock |
| 5,364,179 | A | 11/1994 | Brustle |
| 5,474,375 | A | 12/1995 | Hollenstein |
| 5,580,138 | A | 12/1996 | Grabher |
| 8,132,873 | B2 * | 3/2012 | Yang .................... A47B 88/467 312/333 |
| 8,182,054 | B2 | 5/2012 | Liang |

(Continued)

*Primary Examiner* — James O Hansen
(74) *Attorney, Agent, or Firm* — Winston Hsu (57) ABSTRACT

A driving mechanism for a slide rail assembly with a first and a second rails includes a first driving device, a locking device, a swing member and a second driving device. The first driving device includes a first elastic member and a first base. The first elastic member accumulates a first driving force when the swing member abutting against a locking part of the locking device. The second driving device is mounted to the second rail and includes a second base movably connected to the first base, a blocking member movable in a guiding section of the second base, and a second elastic member. When the second rail and the second base are moved from a retrieve position toward an open position relative to the first rail, the blocking part abuts against a portion of the guiding section for allowing the second elastic member to accumulate a second driving force.

7 Claims, 12 Drawing Sheets

(56) References Cited

U.S. PATENT DOCUMENTS

| | | | |
|---|---|---|---|
| 8,939,525 B1* | 1/2015 | Chen .................... | A47B 88/047 312/333 |
| 2010/0164340 A1* | 7/2010 | Juan .................... | A47B 88/467 312/333 |

* cited by examiner

DRIVING MECHANISM AND GUIDE FITTING FOR SLIDE RAIL ASSEMBLY

BACKGROUND OF THE INVENTION

1. Field of the Invention

The present invention relates to a driving mechanism, and more particularly, to a driving mechanism for a slide rail assembly.

2. Description of the Prior Art

In a furniture system, such as a drawer system, a drawer usually can be opened or closed relative to a cabinet through a pair of slide rail assemblies. A product capable of facilitating a drawer to open from a retrieve position relative to a cabinet is already provided in current market, and the product is so called a push-open product. A product capable of automatically retrieving a drawer relative to a cabinet in an end process of retrieving is also provided in current market, and the product is so called a self-closing product. U.S. Pat. No. 8,182,054 B2 discloses a retraction mechanism for a drawer, which utilizes an elastic member to retract the drawer into a furniture body. The case is provided for reference.

SUMMARY OF THE INVENTION

The present invention relates to a driving mechanism for a slide rail assembly capable of providing a driving force to drive a rail to move relative to another rail.

The present invention further relates to a guide fitting for a self-closing slide rail assembly, in order to reduce a pulling-back force of the slide rail assembly when the slide rail assembly is manually pulled out.

According to an embodiment of the present invention, a driving mechanism for a slide rail assembly is provided. The slide rail assembly comprises a first rail and a second rail movable relative to the first rail. The first rail comprises an engagement feature. The driving mechanism comprises a first driving device, a locking device, a swing member, and a second driving device. The first driving device comprises a first elastic member and a first base. The locking device is connected to the first driving device, and the locking device comprises a locking part and a guiding passage passing through the locking part. The swing member is movably connected to the second rail and moveable in the guiding passage to abut against the locking part. The first elastic member of the first driving device is configured to accumulate a first driving force in response to the swing member abutting against the locking part of the locking device, and the first driving force is configured to drive the second rail to move from a retrieve position to an open position relative to the first rail. The second driving device is mounted to the second rail. The second driving device comprises a second base, a capturing member, a blocking member pivoted to the capturing member, and a second elastic member. The second base is movably connected to the first base, and the second base comprises a first guiding section and a second guiding section communicated with the first guiding section and turned from the first guiding section. The first guiding section has an abutting area. The capturing member is configured to capture the engagement feature of the first rail and has a first guiding pin. The blocking member has a second guiding pin. The first guiding pin of the capturing member and the second guiding pin of the blocking member are movable in the first guiding section, and the second elastic member is arranged between the blocking member and the locking device. Wherein, when the capturing member captures the engagement feature of the first rail, and the second rail is moved from the retrieve position toward the open position relative to the first rail, the second base is moved with the second rail, such that the second guiding pin of the blocking member abuts against the abutting area of the first guiding section to allow the second elastic member to accumulate a second driving force, and the first guiding pin of the capturing member is moved from the first guiding section to the second guiding section of the second base for deflecting the capturing member to disengage from the engagement feature of the first rail.

According to the above embodiment of the driving mechanism, the first rail comprises an auxiliary track, and the driving mechanism further comprises a clutch device connected to the first base of the first driving device and movable along the auxiliary track.

According to another embodiment of the present invention, a guide fitting for a driving device of a driving mechanism comprises a base, a capturing member and a blocking member. The base comprises a first guiding section and a second guiding section communicated with the first guiding section and turned from the first guiding section, and the first guiding section having an abutting area. The capturing member has a first guiding pin. The blocking member is movably connected to the capturing member and has a second guiding pin. Wherein, the first guiding pin of the capturing member and the second guiding pin of the blocking member are movable in the first guiding section of the base. Wherein, when the second guiding pin of the blocking member abuts against the abutting area of the first guiding section, the first guiding pin of the capturing member is moved to the second guiding section of the base to deflect the capturing member.

According to another embodiment of the present invention, a guide fitting for a driving device of a driving mechanism comprises a base, a capturing member and a blocking member. The base comprises a first guiding section and a second guiding section turned from the first guiding section, and the first guiding section has an abutting area. The capturing member has a first guiding pin. The blocking member is pivoted to the capturing member and has a second guiding pin. Wherein, the first guiding pin of the capturing member and the second guiding pin of the blocking member are movable in the first guiding section of the base, and the abutting area of the first guiding section is configured to abut against the second guiding pin of the blocking member.

According to one of the above embodiments of the guide fittings, the abutting area of the first guiding section of the base is a notch.

According to one of the above embodiments of the guide fittings, the guide fitting further comprises an elastic member configured to provide an elastic force to the blocking member.

According to one of the above embodiments of the guide fittings, the blocking member is pivoted to the capturing member.

According to one of the above embodiments of the guide fittings, the blocking member further has a flexible part configured to contact the capturing member.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
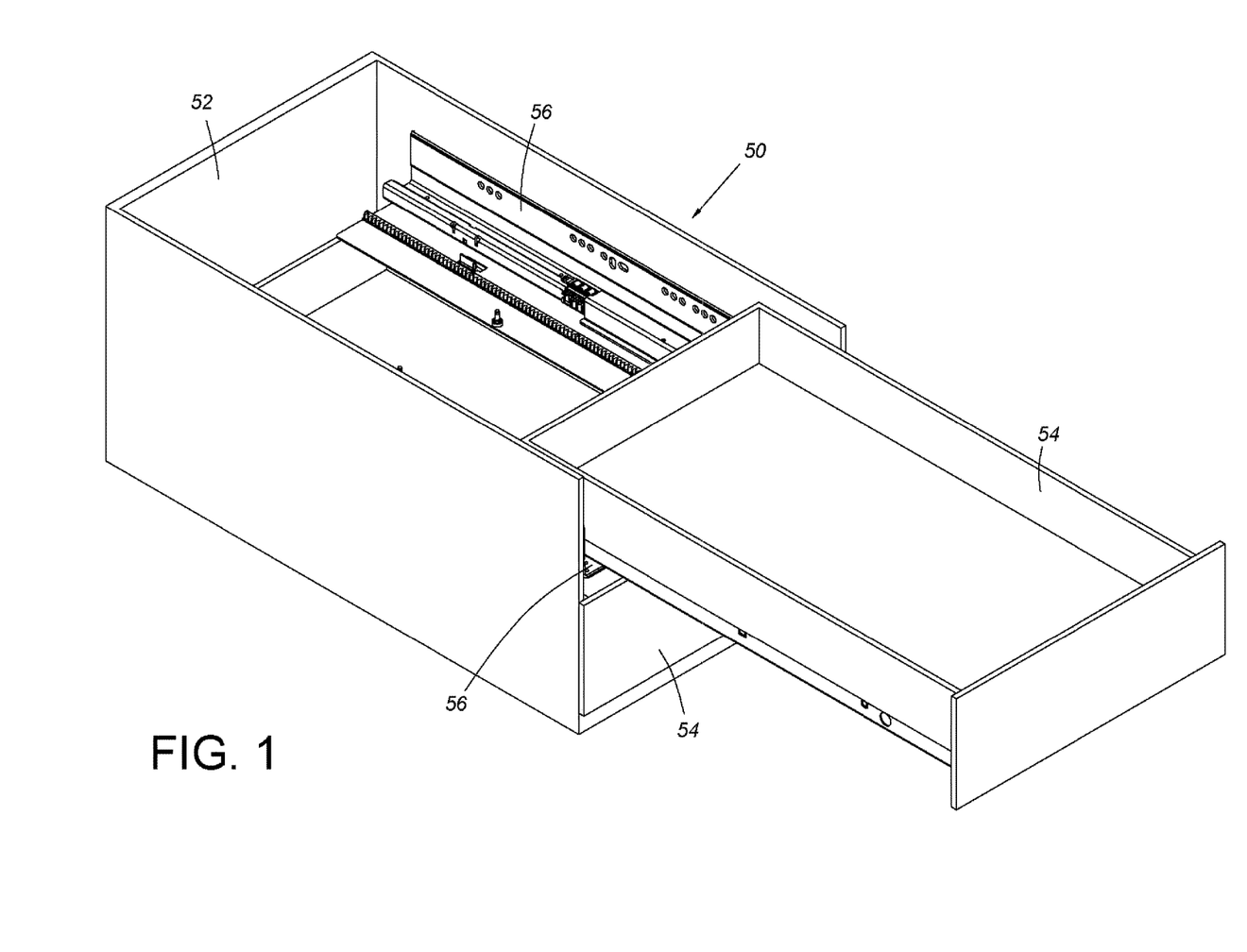
FIG. 1 is a diagram showing a drawer being opened relative to a cabinet according to an embodiment of the present invention.

FIG. 1 shows a system 50 comprising a first furniture part 52, at least one second furniture part 54 and a pair of slide rail assemblies 56 according to an embodiment of the present invention. The system 50 can be furniture or a cabinet. The system 50 can be a furniture system or a rack system. In the present embodiment, the first furniture part is a cabinet for example, and the second furniture part is a drawer for example. The pair of the slide rail assemblies 56 is mounted between the first furniture part 52 and the second furniture part 54. In the present embodiment, the slide rail assemblies 56 are undermount drawer slides, and are respectively mounted to the second furniture part 54 to be adjacent to two sides of a bottom of the second furniture part 54. According to the above arrangement, the second furniture part 54 can be easily opened or closed relative to the first furniture part 52 through the pair of slide rail assemblies 56.

Figure 2:
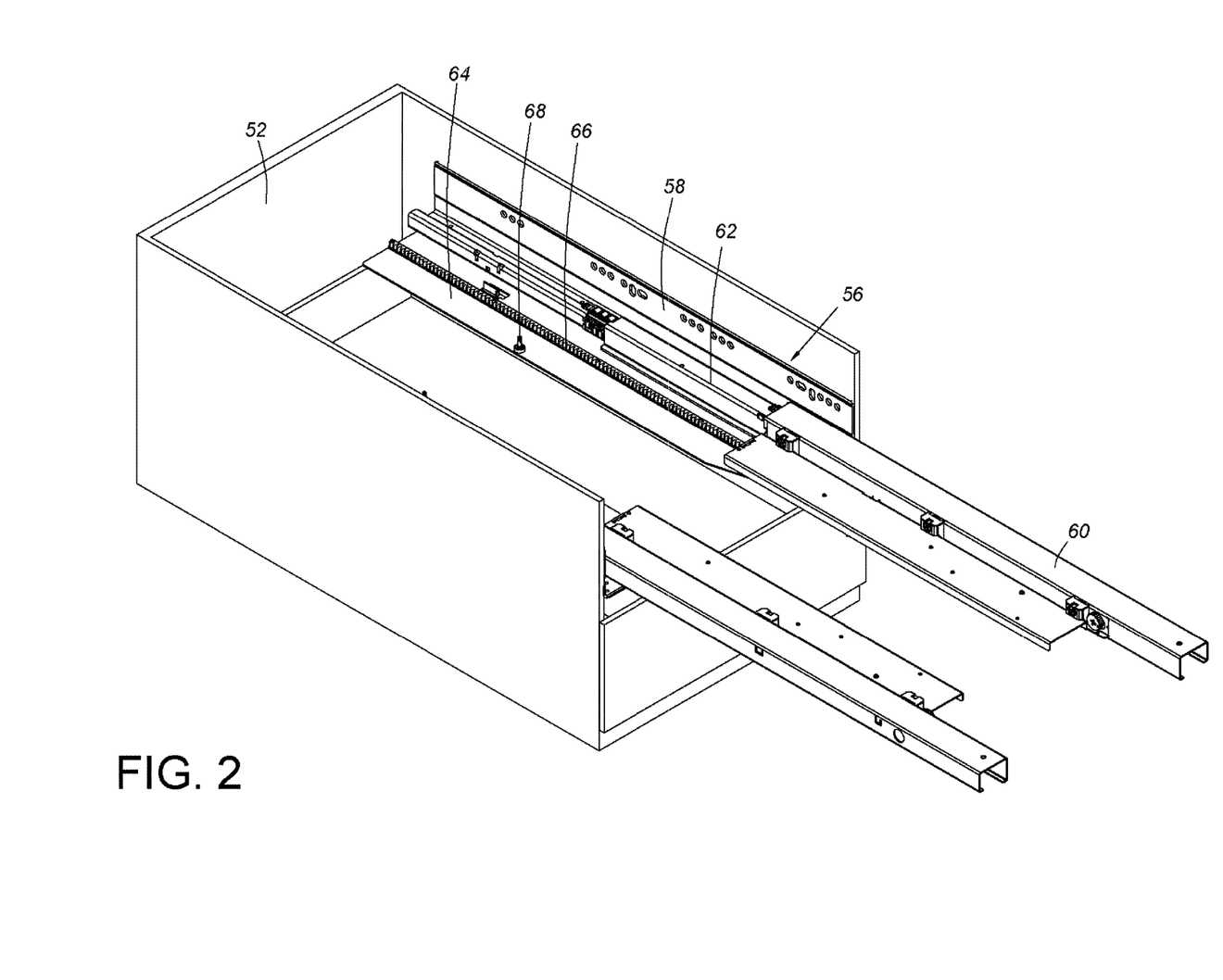
FIG. 2 is diagram showing the cabinet of FIG. 1 with the drawer being removed.

As shown in FIG. 2, the slide rail assembly 56 comprises a first rail 58 and a second rail 60. The first rail 58 is longitudinally and fixedly mounted to the first furniture part 52. As such, the first rail 58 can be seen as a portion of the first furniture part 52. The second rail 60 is longitudinally movable relative to the first rail 58. As such, the second rail 60 can be seen as a portion of the second furniture part 54. Preferably, the slide rail assembly 56 further comprises a third rail 62 movably mounted between the first rail 58 and the second rail 60. The third rail 62 is configured to extend a traveling distance of the second rail 60 relative to the first rail 58. Preferably, the slide rail assembly 56 further comprises an extension base 64 fixedly attached to the first rail 58. The extension base 64 can be seen as a portion of the first rail 58, and the extension base 64 is arranged along a longitudinal direction of the first rail 58. Preferably, the slide rail assembly 56 further comprises an auxiliary track 66 arranged along a longitudinal direction of the extension base 64. In the present embodiment, the auxiliary track 66 is a gear rack. The extension base 64 further comprises an engagement feature 68. The engagement feature 68 can be an independent component fixedly attached on the extension base 64, or the engagement feature 68 can be formed from the extension base 64.

Figure 3:
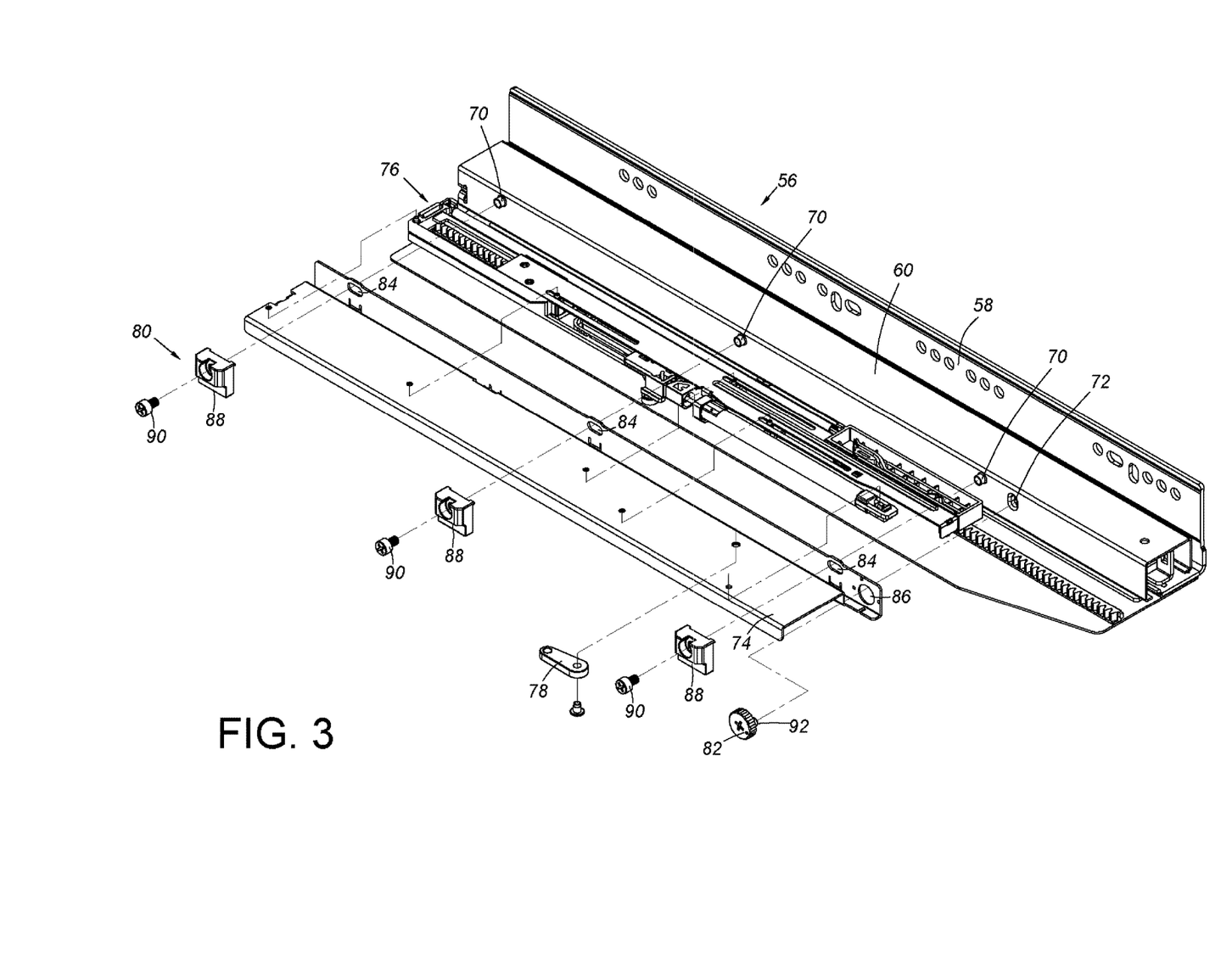
FIG. 3 is an exploded view of the slide rail assembly according to an embodiment of the present invention.

FIG. 3 shows arrangement of a single slide rail assembly 56. The second rail 60 of the slide rail assembly 56 comprises a plurality of protruded connection features 70 and an adjusting hole 72 adjacent to a front end of the second rail 60. The slide rail assembly 56 further comprises a carrying member 74, a driving mechanism 76, a swing member 78, a connection assembly 80 and an adjusting member 82. The carrying member 74 has a plurality of connection holes 84 corresponding to the connection features 70 of the second rail 60, and a through holes 86 corresponding to the adjusting hole 72 of the second rail 60. The driving mechanism 76 is configured to facilitate and drive the second rail 60 to move relative to the first rail 58. The swing member 78 is movably connected, such as pivoted to the carrying member 74. The connection assembly 80 comprises a plurality of connection bases 88 and a plurality of fixing members 90.

Figure 4:
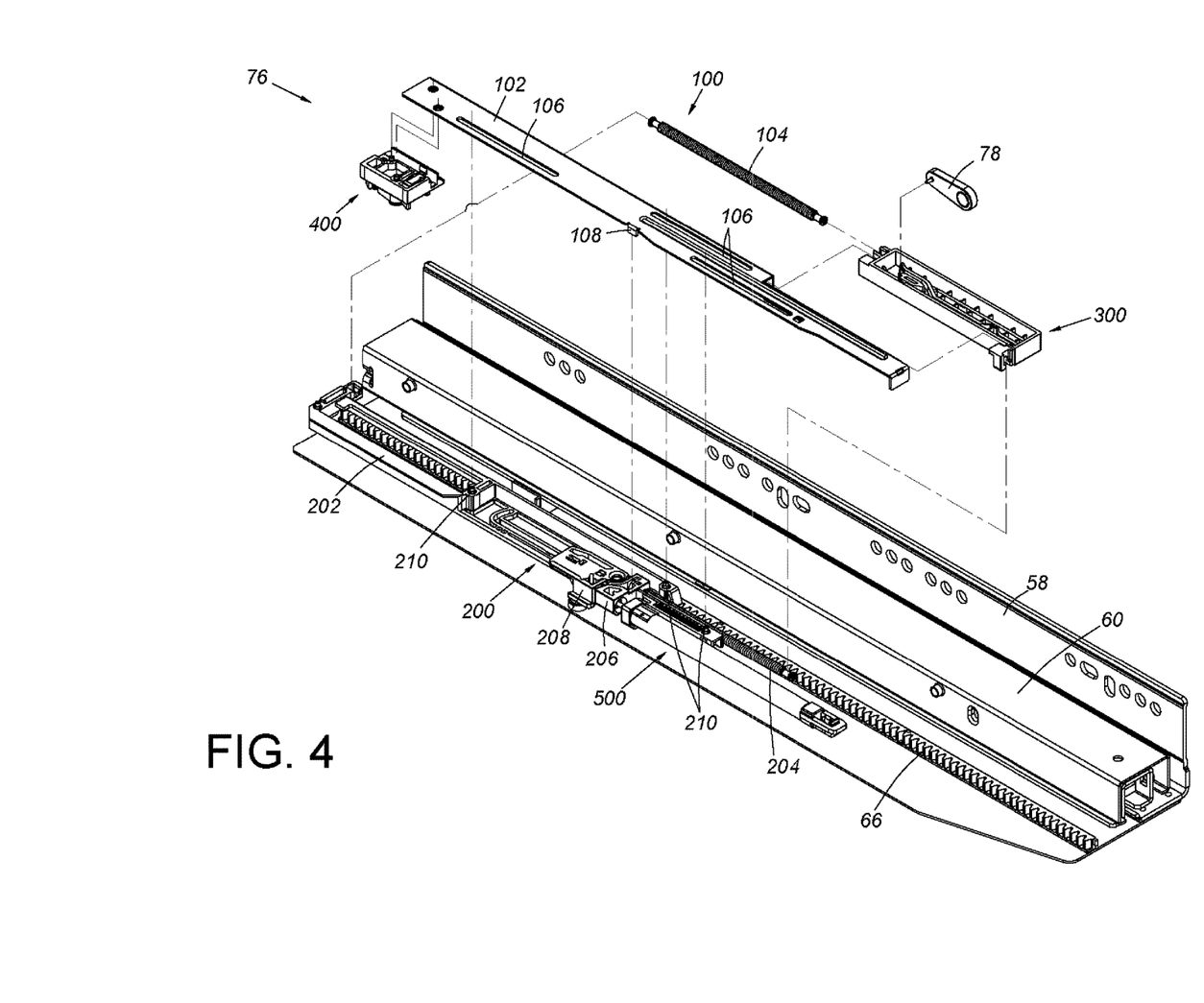
FIG. 4 is an exploded view of the slide rail assembly according to an embodiment of the present invention showing a first driving device, a locking device and a clutch device, wherein the locking device is configured to mount a swing member.

As shown in FIG. 4, the driving mechanism 76 of the present invention comprises a first driving device 100, a second driving device 200, a locking device 300, a clutch device 400 and a damping member 500. The first driving device 100 is connected to the first rail 58 through the clutch device 400. The first driving device 100 comprises a first base 102 and a first elastic member 104. The first base 102 has a plurality of longitudinal slots 106 and a blocking part 108. The second driving device 200 comprises a second base 202, a second elastic member 204, a blocking member 206 and a capturing member 208. The first base 102 and the second base 202 are longitudinally movable relative to each other. For example, the second base 202 has a plurality of base parts 210. Each of the base parts 210 is arranged within a corresponding longitudinal slot 106, such that the first base 102 and the second base 202 are longitudinally movable relative to each other. The first elastic member 104 is configured to provide an elastic force between the second base 202 of the second driving device 200 and the locking device 300. The blocking part 108 corresponds to the blocking member 206 of the second driving device 200. The second driving device 200 is mounted to the second rail 60. The second base 202 is connected, such as fixedly connected to the carrying member 74 (not shown in FIG. 9) of the second rail 60. The second elastic member 204 is configured to provide an elastic force between the blocking member 206 of the second driving device 200 and the locking device 300. The locking device 300 is connected, such as fixedly connected to the first base 102 of the first driving device 100. As such, the locking device 300 can be seen as a portion of the first base 102. The swing member 78 can be operatively switched between a locking status and an unlocking status by the locking device 300. The clutch device 400 is connected, such as fixedly connected to the first base 102 of the first driving device 100. As such, the clutch device 400 can be seen as a portion of the first base 102. The damping member 500 is configured to damp the blocking member 206 of the second driving device 200.

Figure 5:
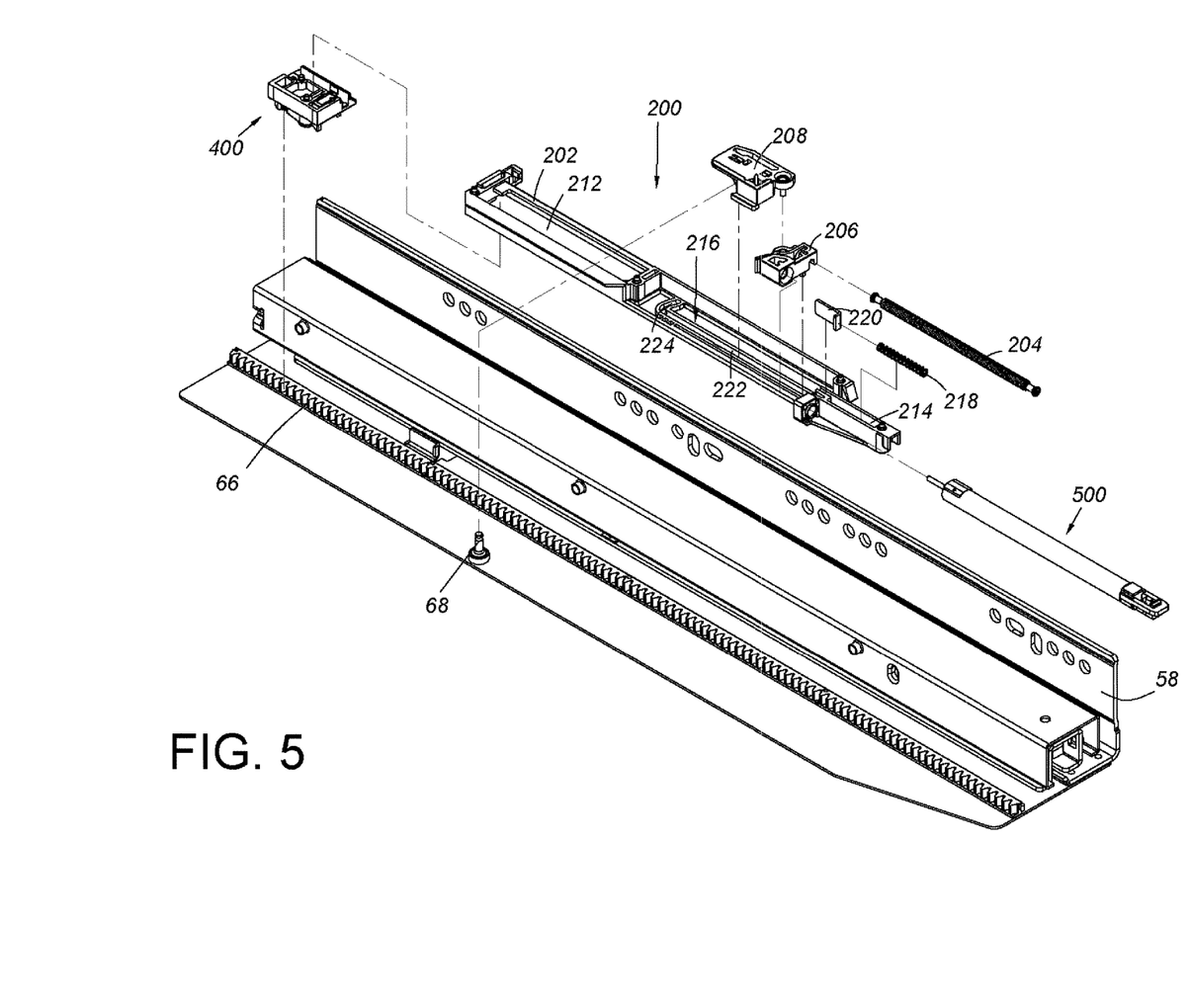
FIG. 5 is an exploded view of the slide rail assembly according to an embodiment of the present invention showing a second driving device, the clutch device and a damping member.

As shown in FIG. 5, a space 212 and a room 214 are formed on the second base 202 of the second driving device 200, and a guiding part 216 is located between the space 212 and the room 214. The clutch device 400 is movably arranged in the space 212 of the second base 202 for moving along the auxiliary track 66. The room 214 is configured to accommodate an auxiliary elastic member 218 and a pushing member 220. The auxiliary elastic member 218 is configured to provide an elastic force to the pushing member 220, such that the pushing member 220 can partially extend out of the room 214 in response to the elastic force of the auxiliary elastic member 218. The guiding part 216 has a first guiding section 222 and a second guiding section 224. The first guiding section 222 has a predetermined length. The second guiding section 224 is turned from the first guiding section 222. The first guiding section 222 and the second guiding section 224 can be two slots or openings communicated with each other. The blocking member 206 of the second driving device 200 is movably connected to the first guiding section 222. The capturing member 208 of the second driving device 200 is pivoted to the blocking member 206, and movably connected to the first guiding section 222. The capturing member 208 is able to move to the second guiding section 224 from the first guiding section 222. The capturing member 208 is configured to capture the engagement feature 68 of the first rail 58.

Figures 6, 7:
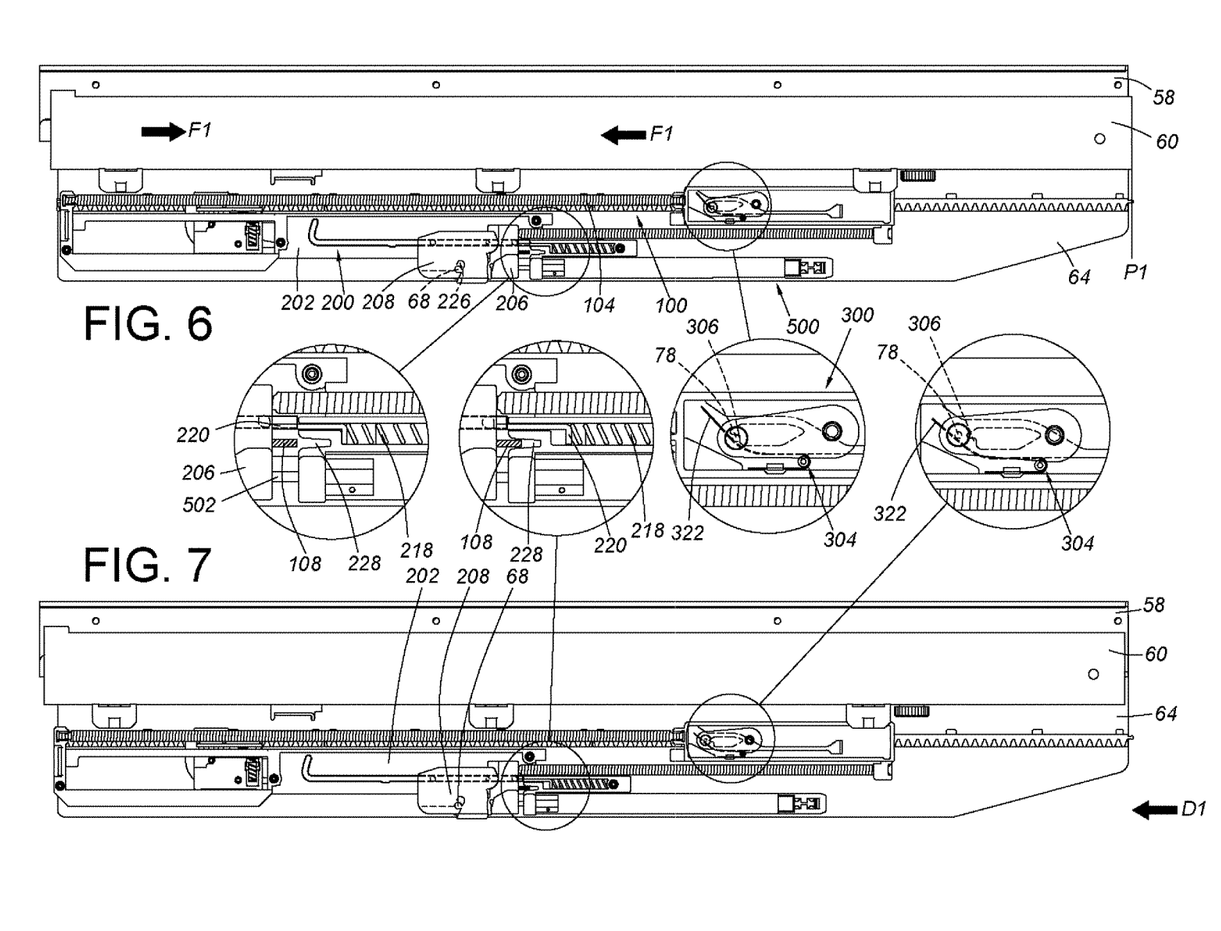
FIG. 6 is a diagram showing a second rail of the slide rail assembly located at a retrieve position relative to a first rail, and a first elastic member of the first driving device accumulating a first driving force due to the swing member abutting against a locking part according to an embodiment of the present invention.
FIG. 7 is a diagram showing the second rail of the slide rail assembly being pushed to move along a first direction relative to the first rail according to an embodiment of the present invention.

As shown in FIG. 6, the second rail 60 is located at a retrieve position P1 relative to the first rail 58. Meanwhile, the swing member 78 abuts against a locking part 306 of the locking device 300, and the first elastic member 104 of the first driving device 100 accumulates a first driving force F1 due to the swing member 78 abutting against the locking part 306. Under such status, the second elastic part 322 of the guiding member 304 elastically abuts against the swing member 78. On the other hand, the capturing member 208 has a capturing feature 226 for capturing the engagement feature 68 of the first rail 58. The capturing feature 226 can be a clasp or recessed structure. In addition, the pushing member 220 is configured to contact the blocking member 206 in response to the elastic force generated by the auxiliary elastic member 218. The blocking part 108 of the first base 102 of the first driving device 100 abuts against the blocking member 206 of the second driving device 200, and the blocking part 108 of the first base 102 of the first driving device 100 corresponds to a notch 228 of the second base 202 of the second driving device 200. The damping member 500 comprises a damping rod 502 for abutting against the blocking member 206.

As shown in FIG. 7, since the capturing member 208 is engaged with the engagement feature 68 of the first rail 58, the second rail 60 is moved from the retrieve position P1 along a first direction D1 relative to the first rail 58 when an external force is applied to the second rail 60 along the first direction D1. The pushing member 220 abuts against the blocking member 206 in response to the external force, and further presses the auxiliary elastic member 218, such that the second rail 60 is moved a short distance from the retrieve position P1 along the first direction D1 relative to the first rail 58. Meanwhile, the notch 228 of the second base 202 of the second driving device 200 is moved relative to the blocking part 108, such that the blocking part 108 extends into the notch 228. On the other hand, the swing member 78 is moved with the second rail 60 along the first direction D1 for pushing the guiding member 304 to disengage from the locking part 306 to be switched to the unlocking status.

Figure 8:
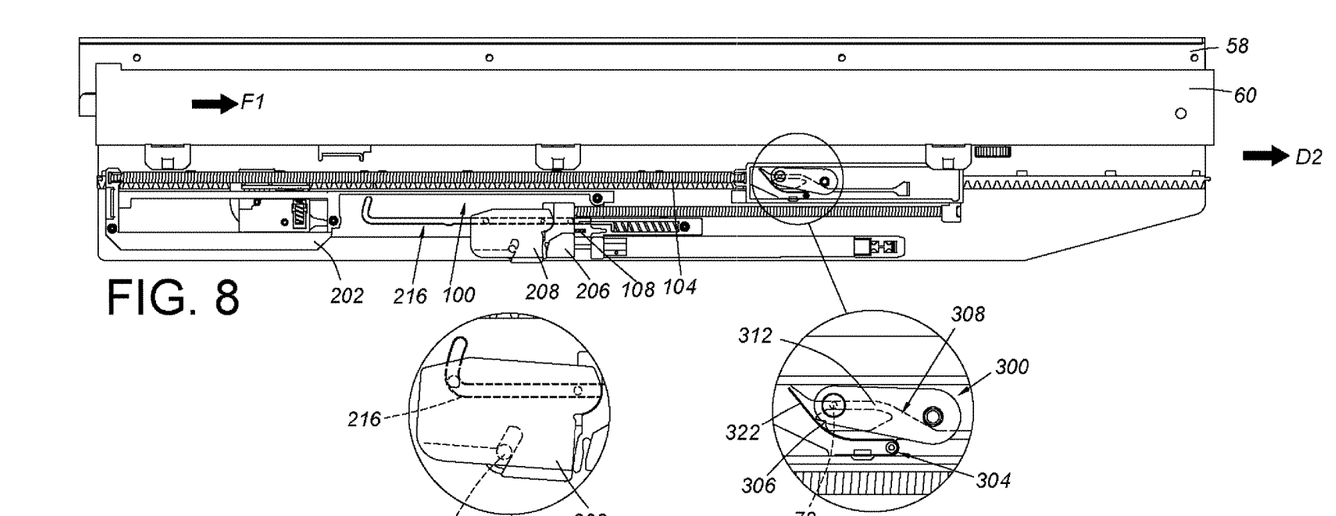
FIG. 8 is a diagram showing the swing member of the slide rail assembly being disengaged from the locking part of the locking device, and the first elastic member releasing an elastic force to drive the second rail to move along a second direction relative to the first rail according to an embodiment of the present invention.
Figure 9:
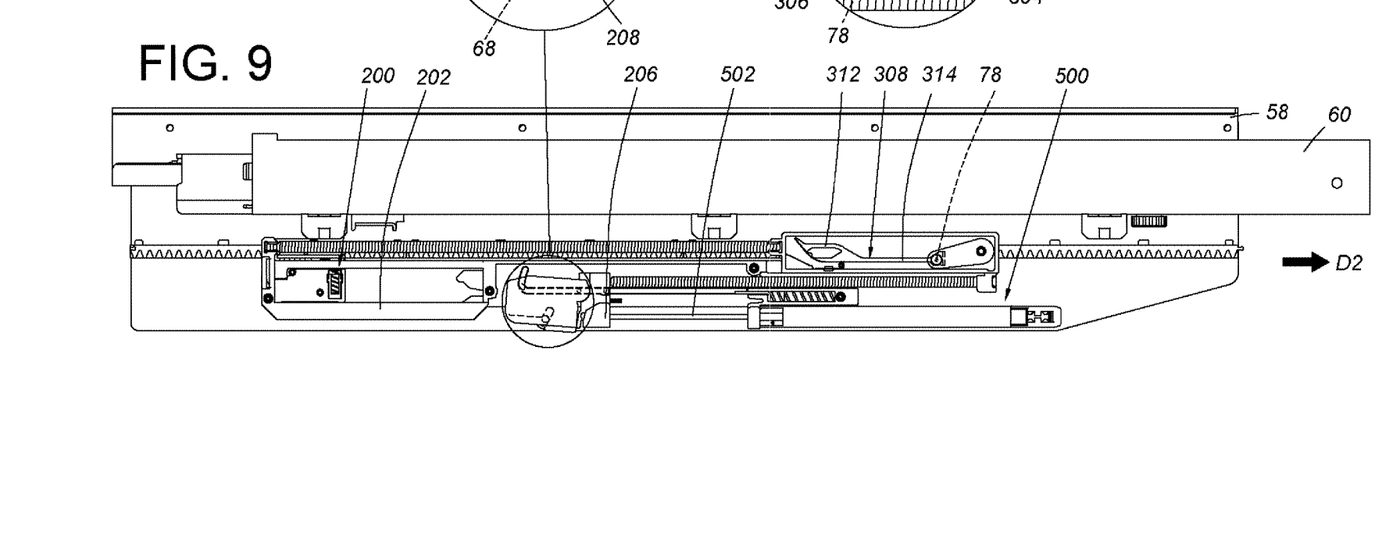
FIG. 9 is a diagram showing the first elastic member further releasing the elastic force to continue driving the second rail to move along the second direction relative to the first rail.

As shown in FIG. 8 and FIG. 9, the locking device 300 comprises a guiding passage 308 passing through the locking part 306. When the swing member 78 is disengaged from the locking part 306 of the locking device 300, the second elastic part 322 of the guiding member 304 can elastically guide the swing member 78 to move to a path 312 of the guiding passage 308. The first elastic member 104 of the first driving device 100 then releases the first driving force F1, such that the second rail 60 is moved from the retrieve position P1 along a second direction D2 relative to the first rail 58. More particularly, after the first elastic member 104 of the first driving device 100 releasing the first driving force F1, the second base 202 of the second driving device 200 is further moved with the second rail 60 along the second direction D2 relative to the first rail 58. In the process of the first elastic member 104 releasing the elastic force, the swing member 78 is moved from the path 312 toward a path 314 of the guiding passage 308. On the other hand, when the second base 202 of the second driving device 200 is moved along the second direction D2, the guiding part 216 of the second driving device 200 is moved relative to the capturing member 208. In addition, the damping rod 502 of the damping member 500 extends to be in a damping ready status and corresponds to the blocking member 206 of the second driving device 200. As mention above, the swing member 78 can be operatively engaged between the locking part 306 and the guiding member 304, for allowing the first elastic member 104 of the first driving device 100 to accumulate the first driving force F1; and the swing member 78 can also be operatively disengaged from the locking part 306 and the guiding member 304, for releasing the first driving force F1, so as to drive the second furniture part 54 to move from the retrieve position to an open position. On the other hand, when the second rail 60 is moved back to the retrieve position P1 relative to the first rail 58, the swing member 78 can be moved to abut against the locking part 306 again through the guiding passage 308.

Figure 10:
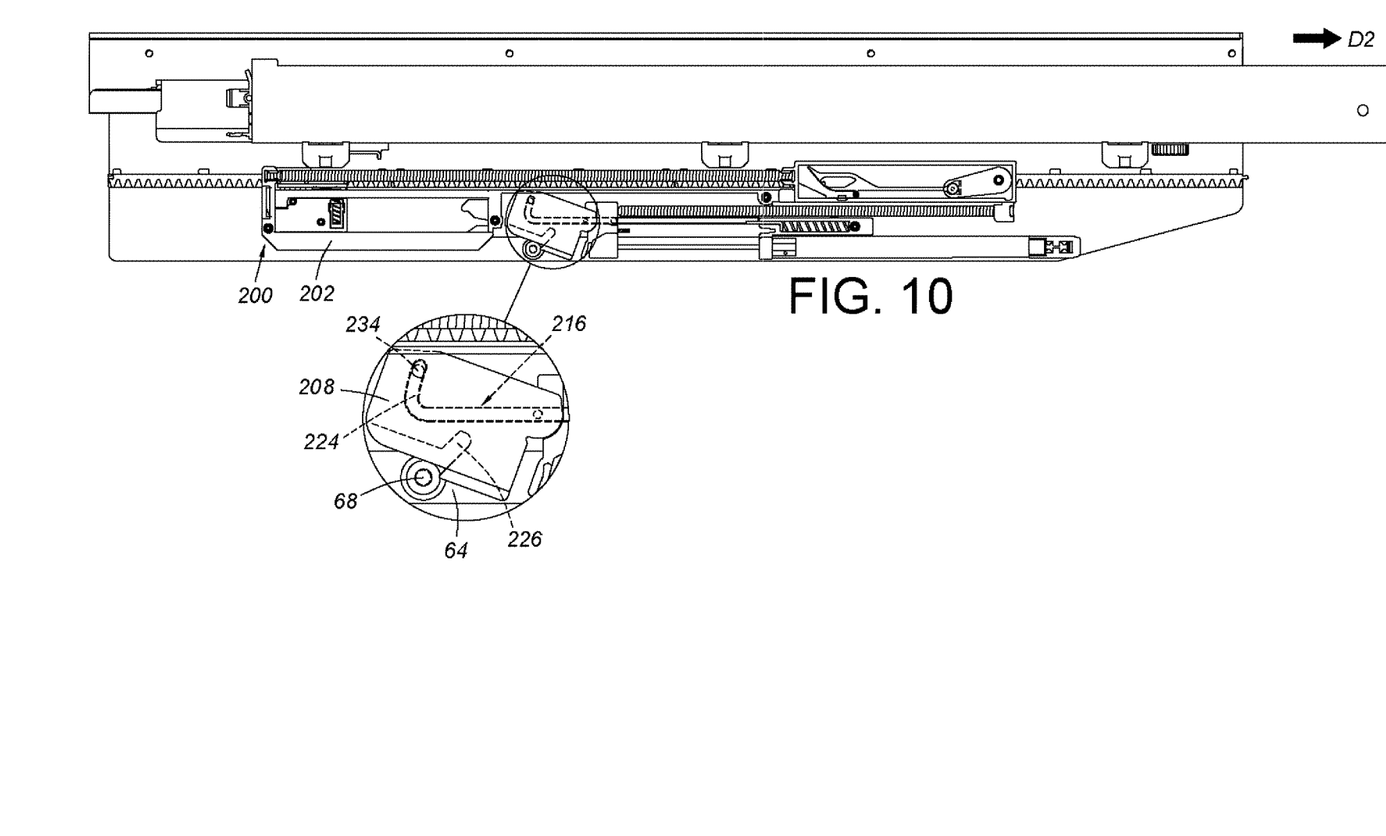
FIG. 10 is a diagram showing the first elastic member of the first driving device of the slide rail assembly releasing the elastic force to drive the second rail to further move along the second direction relative to the first rail according to an embodiment of the present invention, wherein a capturing member is deflected to disengage from an engagement feature.

As shown in FIG. 10, when the second base 202 of the second driving device 200 is moved further along the second direction D2, through guiding of the second guiding section 224 of the guiding part 216 of the second base 202, a first guiding pin 234 of the capturing member 208 is moved to the second guiding section 224 of the guiding part 216, such that the capturing member 208 is deflected, and the capturing feature 226 of the capturing member 208 is disengaged from the engagement feature 68 of the extension base 64.

Figure 11:
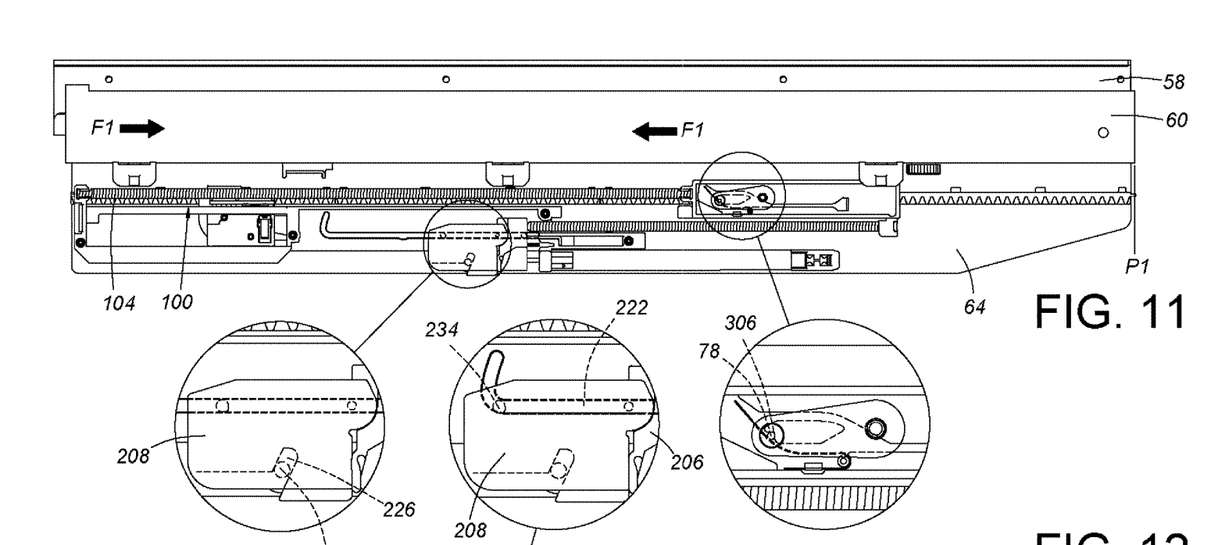
FIG. 11 is a diagram showing the second rail located at a retrieve position relative to the first rail, wherein the capturing member captures the engagement feature of the first rail, and the first elastic member of the first driving device generates the first driving force.
Figure 12:
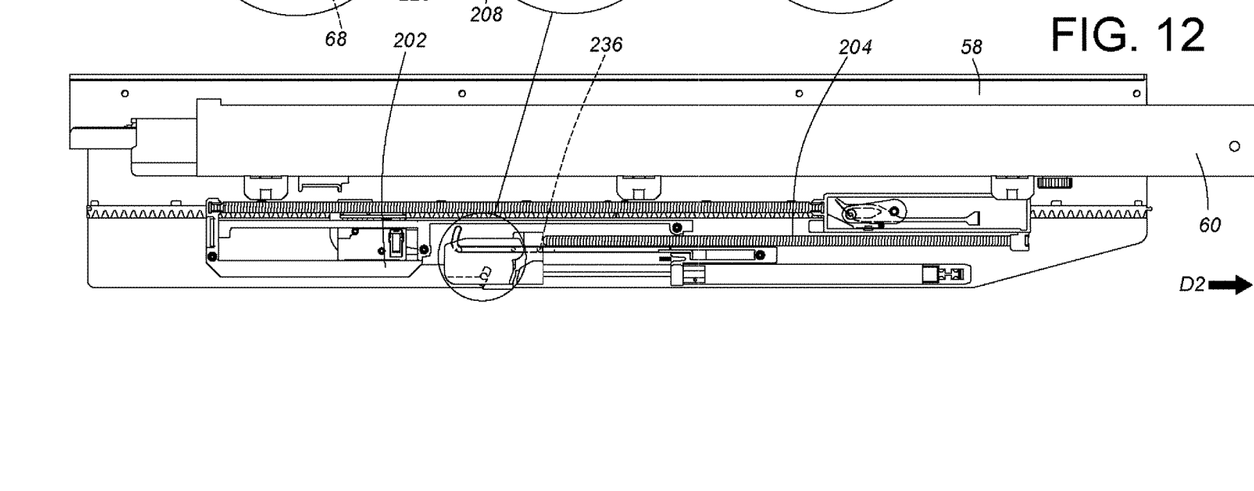
FIG. 12 is a diagram showing the second rail of FIG. 11 being moved from the retrieve position toward an open position relative to the first rail.

As shown in FIG. 11 and FIG. 12, the first elastic member 104 of the first driving device 100 accumulates the first driving force F1 in response to the swing member 78 abutting against the locking part 306, and the capturing feature 226 of the capturing member 208 captures the engagement feature 68 of the extension base 64 of the first rail 58. In an operation mode of the slide rail assembly 56, an user can directly pulls out the second rail 60 from the retrieve position P1 toward the open position along the second direction D2 relative to the first rail 58, such that the second base 202 is moved with the second rail 60 along the second direction D2, and the first guiding pin 234 of the capturing member 208 and a second guiding pin 236 of the blocking member 206 are movable in the first guiding section 222 of the second base 202. Since the capturing member 208 and the engagement feature 68 of the first rail 58 are mutually engaged, and an end of the second elastic member is fixed to the blocking member 206, the second elastic member 204 is stretched along the second direction.

Figure 13:
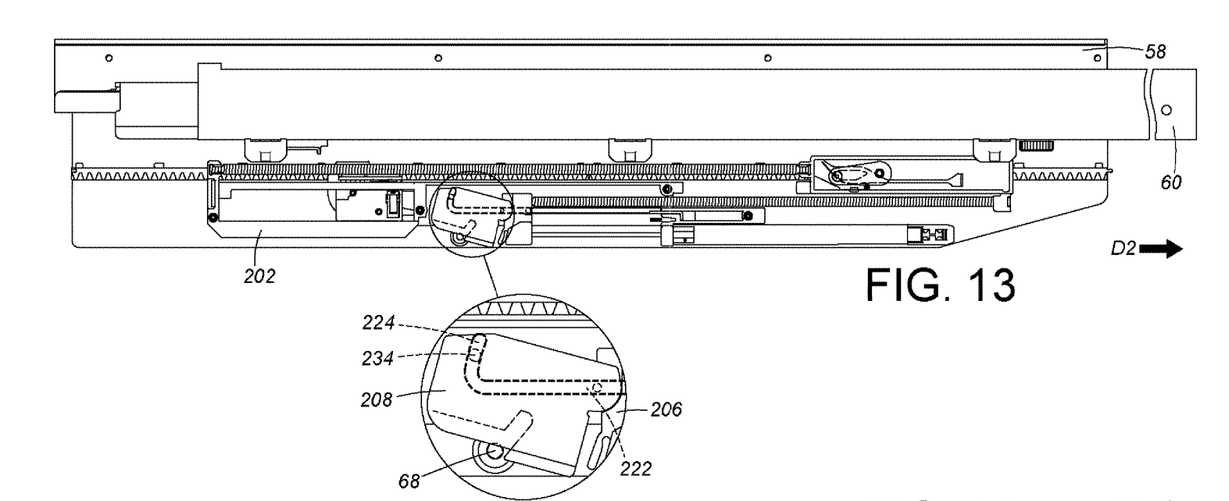
FIG. 13 is a diagram showing a second base being further moved with the second rail according to an embodiment of the present invention, wherein the capturing member is disengaged from the engagement feature.

As shown in FIG. 13, when the second base 202 is further moved with the second rail 60 along the second direction D2 relative to the first rail 58, the first guiding pin 234 of the capturing member 208 is moved from the first guiding section 222 to the second guiding section 224, such that the capturing member 208 is deflected relative to the blocking member 206, and the capturing member 208 is disengaged from the engagement feature 68 of the first rail 58.

Figure 14:
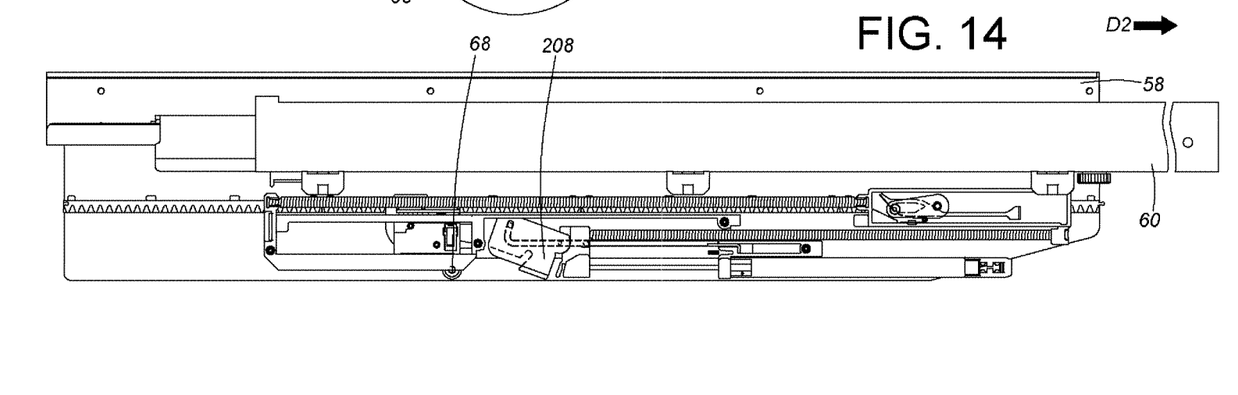
FIG. 14 is a diagram showing the second rail of FIG. 13 being further moved relative to the first rail.

As shown in FIG. 14, after the capturing member 208 is disengaged from the engagement feature 68 of the first rail 58, the second rail 60 can be further pulled out along the second direction D2 relative to the first rail 58.

Figure 15:
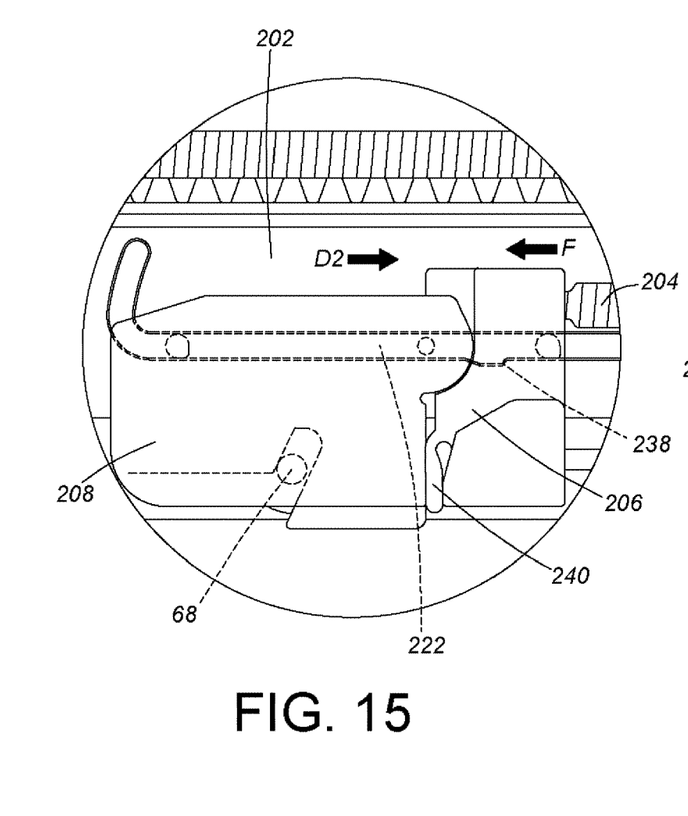
FIG. 15 is a diagram showing a guide fitting according to an embodiment of the present invention, wherein a first guiding section of the second base has an abutting area.

As shown in FIG. 15, the second base 202, the second elastic member 204, the capturing member 208 and the blocking member 206 of the second driving device 200 can form a guide fitting. The first guiding section 222 of the second base 202 has an abutting area 238. The abutting area 238 can be a notch for example. On the other hand, the blocking member 206 has a flexible part 240 configured to contact the capturing member 208. In the present embodiment, the flexible part 240 is arranged to be tilted.

Figure 16:
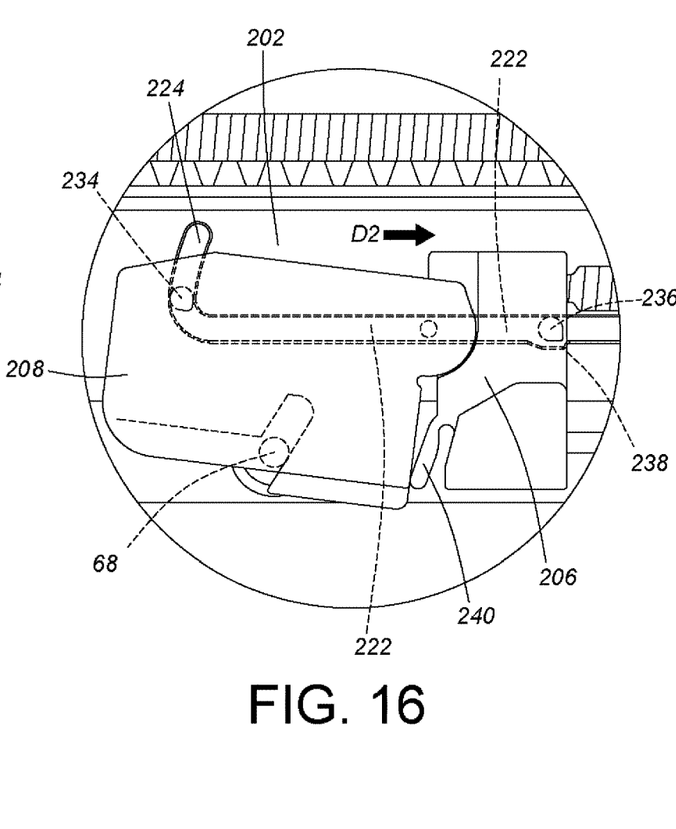
FIG. 16 is a diagram showing the guide fitting according to an embodiment of the present invention, wherein the first guiding section of the second base has the abutting area configured to abut against a guiding pin of a blocking member.

As shown in FIG. 16, during a process of the second base 202 being moved with the second rail 60 (not shown in FIG. 16) from the retrieve position P1 along the second direction D2, since the capturing member 208 and the engagement feature 68 of the first rail 58 (not shown in FIG. 16) are mutually engaged, the second elastic member 204 is stretched along the second direction D2 by a force applied to the second rail 60. That is to say, the user must overcome an elastic force F of the second elastic member 204 provided to the blocking member 206, until the second guiding pin 236 of the blocking member 206 enters and abuts against the abutting area 238 of the first guiding section 222 of the second base 202 to cancel out the elastic force F of the second elastic member 204. In other words, the second elastic member 204 can accumulate a second driving force (the second elastic force is configured to retrieve the second rail 60 relative to the first rail 58) for allowing the user to continue pulling the second rail 60 with the second base 202 along the second direction D2 with less effort. In such process, the first guiding pin 234 of the capturing member 208 can be gradually moved from the first guiding section 222 to the second guiding section 224 of the second base 202, such that the capturing member 208 can be gradually disengaged from the engagement feature 68.

Figure 17:
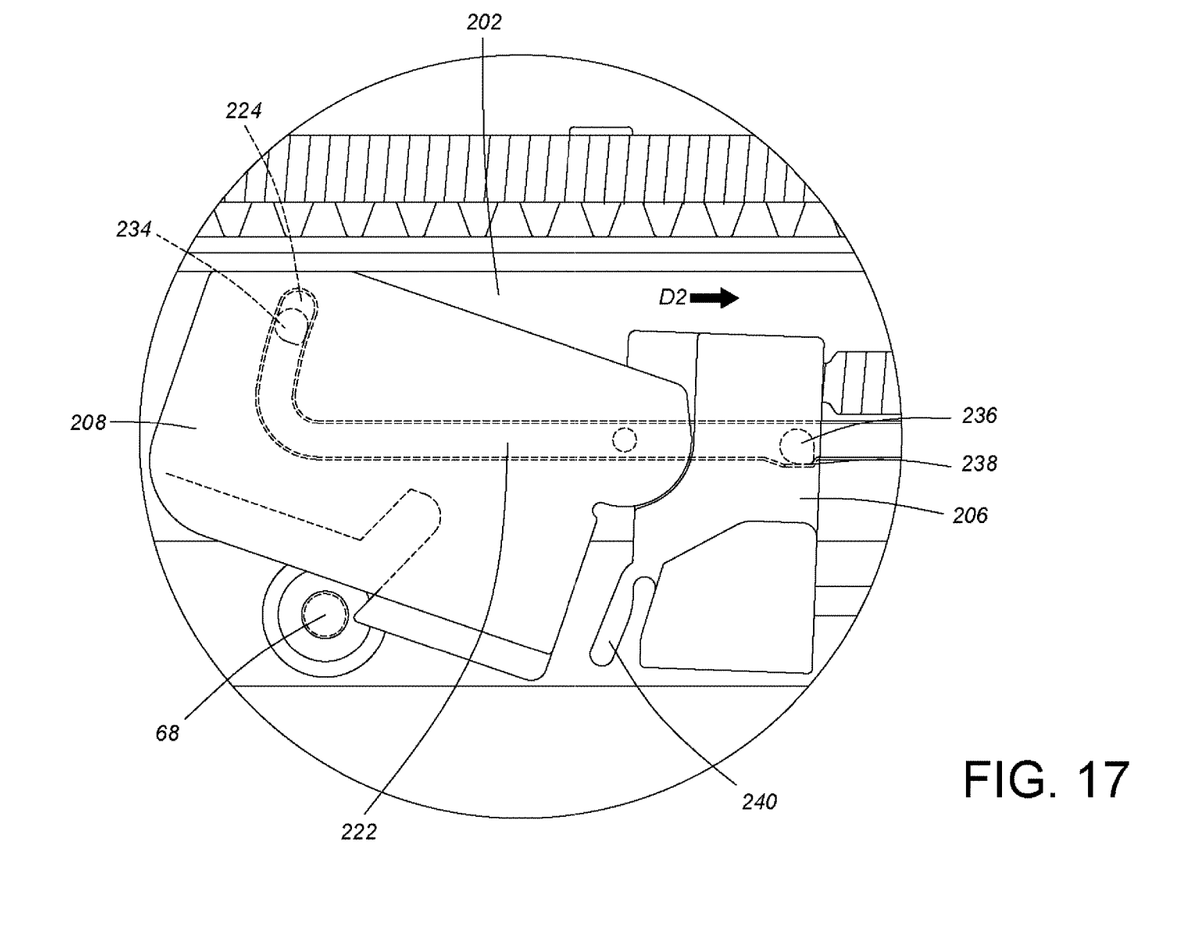
FIG. 17 is a diagram showing the guide fitting according to an embodiment of the present invention, wherein the guiding pin of the blocking member abuts against the abutting area of the first guiding section of the second base, and a guiding pin of the capturing member enters a second guiding section of the second base.

As shown in FIG. 17, when the second base 202 is further moved with the second rail 60 along the second direction D2, the first guiding pin 234 of the capturing member 208 is moved from the first guiding section 222 to the second guiding section 224 of the second base 202, such that the capturing member 208 is completely disengaged from the engagement feature 68. Meanwhile, the capturing member 208 no longer contacts the flexible part 240 of the blocking member 206. In addition, in an operation mode of the slide rail assembly, when the first guiding pin 234 of the capturing member 208 is moved from the second guiding section 224 back to the first guiding section 222 of the second base 202, the capturing member 208 contacts the flexible part 240 of the blocking member 206 again, to return to the previous status shown in FIG. 15 and FIG. 16.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A guide fitting for a driving device of a driving mechanism, comprising:
   a base comprising a first guiding section and a second guiding section communicated with the first guiding section and turned from the first guiding section, the first guiding section having an abutting area;
   a capturing member having a first guiding pin;
   a blocking member movably connected to the capturing member and having a second guiding pin; and
   an elastic member configured to provide an elastic force to the blocking member;
   wherein the first guiding pin of the capturing member and the second guiding pin of the blocking member are movable in the first guiding section of the base;
   wherein when the second guiding pin of the blocking member abuts against the abutting area of the first guiding section, the first guiding pin of the capturing member is moved to the second guiding section of the base to deflect the capturing member.

2. The guide fitting of claim 1, wherein the abutting area of the first guiding section of the base is a notch.

3. The guide fitting of claim 1, wherein the blocking member is pivoted to the capturing member.

4. The guide fitting of claim 1, wherein the blocking member further has a flexible part configured to contact the capturing member.

5. A guide fitting for a driving device of a driving mechanism, comprising:
   a base comprising a first guiding section and a second guiding section turned from the first guiding section, the first guiding section having an abutting area;
   a capturing member having a first guiding pin;
   a blocking member pivoted to the capturing member and having a second guiding pin; and
   an elastic member configured to provide an elastic force to the blocking member;
   wherein the first guiding pin of the capturing member and the second guiding pin of the blocking member are movable in the first guiding section of the base, and the abutting area of the first guiding section is configured to abut against the second guiding pin of the blocking member.

6. The guide fitting of claim 5, wherein the abutting area of the first guiding section of the base is a notch.

7. The guide fitting of claim 5, wherein the blocking member further has a flexible part configured to contact the capturing member.

\* \* \* \* \*